United States Patent [19]
Usuki

[11] Patent Number: 5,369,288
[45] Date of Patent: Nov. 29, 1994

[54] SEMICONDUCTOR DEVICE FOR SWITCHING A BALLISTIC FLOW OF CARRIERS

[75] Inventor: Tatsuya Usuki, Kawasaki, Japan

[73] Assignee: Fujitsu Limited, Kawasaki, Japan

[21] Appl. No.: 57,842

[22] Filed: May 7, 1993

[30] Foreign Application Priority Data

May 8, 1992 [JP] Japan .................................. 4-116068

[51] Int. Cl.$^5$ ............................................ H01L 29/84
[52] U.S. Cl. ....................................... 257/26; 257/27; 257/192; 257/194; 257/284; 257/623
[58] Field of Search .................. 257/26, 27, 192, 194, 257/284, 623

[56] References Cited

U.S. PATENT DOCUMENTS

| 4,563,696 | 1/1986 | Jay | 257/27 |
| 4,903,092 | 2/1990 | Luryi et al. | 257/197 X |
| 5,130,765 | 7/1992 | Van Houten et al. | 257/192 |

FOREIGN PATENT DOCUMENTS 3-91961 4/1991 Japan .

OTHER PUBLICATIONS

Sivan et al., "Hot Electron Transport in Two Dimensional Electron Gas", *Solid-State Electronics*, vol. 33, No. 7, 1990, pp. 979-986.

Spector et al, "Refractive Switch for Two-Dimensional Electrons," *Appl. Phys. Lett*, 56(24), 11 Jun. 1990, pp. 2433-2435.

Datta et al, "Novel Interference Effects Between Parallel Wells", *Physical Review Letters*, vol. 55, No. 21, 18 Nov. 1985, pp. 2344-2347.

*Primary Examiner*—William Mintel
*Attorney, Agent, or Firm*—Staas & Halsey

[57] ABSTRACT

In a semiconductor device, a channel layer of an undoped semiconductor material passes carriers therethrough ballistically, a carrier injection part injects the carriers into the channel layer with directivity to form a quantum mechanical wave of carriers, a carrier collection part provided on the channel layer recovers the carriers; a carrier drainage part provided on the channel layer absorbs the carriers that have been scattered; a carrier control part controls the flow of the carriers from the carrier injection part to the carrier collection part; and a potential control layer, provided adjacent to the channel layer, controls the potential level of the channel layer such that the potential level is uniform throughout the channel layer.

12 Claims, 10 Drawing Sheets

SEMICONDUCTOR DEVICE FOR SWITCHING A BALLISTIC FLOW OF CARRIERS

BACKGROUND OF THE INVENTION

The present invention generally relates to semiconductor devices and, more particularly, to a semiconductor device for switching a ballistic flow of carriers with an improved signal-to-noise ratio.

Conventional integrated circuits generally employ bipolar transistors or MOS transistors for signal amplification or switching. Particularly, the high electron mobility transistors (HEMT) and the metal semiconductor field effect transistors (MESFET) that employ the high electron mobility of compound semiconductor materials are characterized by high operational speed and are used in various integrated circuits designed to operate in the microwave frequency range.

In order to fully exploit the excellent high speed performance of these devices, efforts are being made to fabricate the integrated circuits with increased integration density. Such an effort includes the development of submicron patterning techniques for writing a device pattern on a semiconductor wafer with a pattern width that is substantially smaller than 1 $\mu$m. With the progress of the submicron patterning technique, semiconductor devices having a size of a few microns or less are now becoming available.

In such submicron devices, although the integration density is increased for increased operational speed, the behavior of electrons in the form of electron waves appears as a strong characteristic and the normal bipolar or MOS operation of the device, that assumes the electrons behave as particles, may be deteriorated, for example by the diffraction or interference of the electron waves.

On the other hand, there is proposed a device called an electron wave device that assumes the wave nature of electrons for the basis of operation. In such electron wave devices, the electron waves are used positively for the device operation and, because of this, the device is free from the problems of excessive miniaturization which affect conventional type semiconductor devices. In fact, the electron wave devices can be miniaturized without theoretical limitation, and such devices are potentially capable of providing the superior performance to that of conventional semiconductor devices with respect to integration density, operational speed, and the like.

FIGS. 1(A)–1(C) show an example of such a quantum interference semiconductor device, as is disclosed in the European Laid-open Patent Application EP-A-0 381 592. This prior art device has a pair of quantum point contacts 10a and 10b for splitting an incident electron wave of a single electron into a pair of electron waves, and the electron waves experience a phase shift upon passage through the respective quantum point contacts 10a and 10b. Upon merging again, the electron waves interfere with each other and produce an output current. The quantum point contact herein means a one-dimensionally confined region acting as a passage of carriers for connecting a first two-dimensional region and a second two-dimensional region with each other. The quantum point contact is confined to have a width such that a number of discrete quantum levels is formed therein and to have a limited length that is approximately equal to or smaller than the elastic or inelastic scattering length of the electrons.

When an electron wave enters into such a quantum point contact, the electron wave experiences a shift in phase in correspondence to the quantum level formed in the quantum point contact. The prior art electron wave device controls the quantum level of the respective quantum point contacts for controlling the mutual phase difference of the electron waves. The device is turned on when the two electron waves undergo a constructive interference and is turned off when the two electron waves undergo destructive interference.

Referring to FIGS. 1(A) and 1(B), this prior art electron device is formed upon a layered semiconductor body 10 in which a two-dimensional electron gas is formed. The layered semiconductor body 10 includes an n+-type AlGaAs doped layer 11 for supplying electrons and an undoped GaAs channel layer 13, with an intervening undoped AlGaAs spacer layer 12 as usual. In this structure, the foregoing two-dimensional electron gas is formed along an upper boundary of the channel layer 13 in correspondence to the heterojunction interface between the AlGaAs layer 12 having a large band gap and the GaAs layer 13 having a smaller band gap, as is well known in the HEMT structure.

Similar to the usual HEMT, there is provided a source electrode 15 and a drain electrode 16 on the doped AlGaAs layer 11 with an ohmic contact to the layer 11, and the source electrode 15 injects the electrons into the two-dimensional electron gas while the drain electrode 16 recovers the electrons from the two-dimensional electron gas. In the region of the layer 11 formed between the source electrode 15 and the drain electrode 16, there are provided Schottky electrodes 17 and 18 to interrupt the flow of electrons from the source electrode 15 to the drain electrode 16 such that the Schottky electrode 17 is separated from the Schottky electrode 18 by a gap, and there is provided another Schottky electrode 25 in correspondence to the gap between the electrodes 17 and 18.

In this structure, it will be understood that there are formed a pair of electron passages, or passageways, one between the electrode 17 and the electrode 25, and the other between the electrode 18 and the electrode 25. These passages 24, however, are confined laterally when viewed in the direction of the flow of electrons, as shown in FIG. 1(B), due to the depletion regions 21, 22 and 23 formed under the electrodes 17, 18 and 25. Thereby, there appear discrete quantum levels in each of the passages 24 when the width of the passage is confined to a dimension substantially smaller than the de Broglie length of the electron waves. Further, each of the electrodes 17, 18 and 25 has a size in the propagating direction of the electron waves typically, of 1–2 $\mu$m or less, and thus smaller than any of the elastic and inelastic scattering lengths of the electrons. Thereby, it will be understood that each of these passages 24 forms a quantum point contact as defined before.

When a single electron is injected by the source electrode 15, the electron, represented by the electron wave W0 in FIG. 1(C), passes through the quantum point contacts as the split pair of electron waves W1 and W2, wherein the electron waves W1 and W2 represent the probability of the electron passing the respective channels. Upon passage through the quantum point contacts, the electron waves W1 and W2 merge with each other and undergo the interference as described previously.

FIG. 2 shows another example of the conventional quantum semiconductor device disclosed in the European Laid-open Patent Application EP-A-0 461 867 wherein a two-dimensional electron gas 30 is formed along a heterojunction interface, similarly to the previous device. Schottky barriers 32a and 32b are formed adjacent to an emitter 31 with a quantum point contact 30a formed therebetween, and an electron wave is radiated from the quantum point contact 30a with a directivity determined by the quantum state of the electron wave as indicated by an angle $\theta$, upon injection of the electrons from the emitter 31.

The electron wave thus radiated experiences a refraction by a potential that is induced by a control electrode (not illustrated) similarly to an optical wave and is detected by another quantum point contact 30b that is formed between a pair of Schottky barriers 34a and 34b. When the electron wave hits the quantum point contact 30b, an output voltage is detected by a collector 35.

Further, Japanese Laid-open Patent Publication 3-91961 corresponding to the U.S. patent application Ser. No. 400,416 by Heiblum describes an electron wave device that uses a potential prism for refracting and reflecting an incident electron wave. There, the device injects electron waves via one or more quantum point contacts, and the refracted or reflected electron waves are detected by a plurality of collectors that are provided also in the form of quantum point contacts.

In such conventional quantum semiconductor devices, it has been noticed that the output voltage obtained at the collector is generally very small. The reason of this undesirable effect is attributed to the existence of the two-dimensional electron gas also in the region located below the collector electrode. More specifically, any voltage change induced in the collector in response to the detection of the electron wave tends to be canceled out by a flow of electrons that occurs in the two-dimensional electron gas so as to compensate for any change in the potential. In order to detect such a very small output voltage, an amplifier having a very large input impedance such as a lock-in amplifier has to be used. However, such an amplifier has a complex construction and use of the quantum semiconductor device in practical applications has been discouraged. In the device of Heiblum that includes a plurality of collectors, too, such a counter-flow of carriers occurring in the two-dimensional electron gas obscures the switching operation of the electron wave between different collectors. Thus, conventional quantum semiconductor devices have suffered from the problem of small logic amplitude. Further, the voltage applied to the collector region tends to affect the refraction or interference of the electron waves.

In addition, the conventional device described previously has a problem of large capacitance between the control electrode used for inducing the potential 33 and the electrons included in the two-dimensional electron gas. Thereby, a very large control voltage and electric power has been needed for controlling the flow of electrons to obtain a very small output voltage. Further, the conventional device that uses the two-dimensional electron gas has another drawback in that the injected electron waves tends to experience scattering by the electrons excited thermally in the two-dimensional electron gas. Thus, the conventional devices exhibit the switching operation only at very low temperatures in the order of 1K. Even when the electron wave is injected in the form of hot electrons, scattering of the electrons in the two-dimensional electron gas is inevitable due to the electron-electron interaction.

Summarizing the above, conventional quantum semiconductor devices that use the quantum mechanical carrier wave have been extremely vulnerable to noise and could be operated only under an extremely low temperature environment.

SUMMARY OF THE INVENTION

Accordingly, it is a general object of the present invention to provide a novel and useful semiconductor device, wherein the foregoing problems are eliminated.

Another and more specific object of the present invention is to provide a semiconductor device that uses a ballistic flow of carriers, wherein the problem of scattering of the ballistic carriers by those carriers forming the two-dimensional carrier gas is eliminated.

Another object of the present invention is to provide a semiconductor device that produces an output voltage in response to a detection of a ballistic flow of carriers, wherein the magnitude of the detected output voltage is maximized.

Another object of the present invention is to provide a quantum semiconductor device operating based upon a quantum mechanical wave of carriers, wherein the output of the device is substantially free from the effect of carriers causing scattering in the quantum mechanical wave.

Another object of the present invention is to provide a semiconductor device, comprising:

a channel layer of an undoped semiconductor material for passing carriers therethrough, said channel layer having upper and lower major surfaces extending two-dimensionally in a longitudinal direction and in a lateral direction that is perpendicular to said longitudinal direction;

carrier injection means provided on said channel layer for injecting carriers into said channel layer with a directivity such that the carriers travel ballistically through said channel layer in a predetermined direction along a carrier path;

carrier detection means provided on said channel layer for detecting said carriers injected by said carrier injection means;

carrier drainage means provided on said channel layer for absorbing carriers that have strayed away from said carrier path; and potential control means extending parallel to said upper and lower major surfaces of said channel layer for controlling a potential in said channel layer such that said potential is substantially constant in said channel layer in said longitudinal and lateral directions.

According to the present invention, use of the two-dimensional carrier gas, that has been used as a medium for carrying signals in the conventional quantum semiconductor devices, is eliminated. Thereby, the carriers travel through the channel layer ballistically while experiencing little scattering by the carriers that form the two-dimensional carrier gas. Further, any strayed carriers are absorbed by the carrier drainage means and the mixing of noise into the output signal detected at the carrier detection means is minimized. In addition, the potential inside the channel layer is maintained substantially constant by the potential control means. Thereby, the semiconductor device of the present invention can provide a large logic amplitude without cooling the device to an extremely low temperature such as 1K. In fact, the device of the present invention can be operated up to a temperature of about 77K above which the effect of phonon scattering becomes significant.

In a preferred embodiment of the present invention, the channel layer is formed to have a reduced thickness such that the carriers traveling therethrough have a quantized energy level. In another preferred embodiment, the carrier injection means forms a quantum point contact for radiating the carriers into the channel layer in the form of a quantum mechanical carrier wave. In still another preferred embodiment, the device has carrier control means supplied with a control signal for controlling said carrier path in response thereto.

Other objects and further features of the invention will become apparent from the following detailed description when read in conjunction with the attached drawings.

DETAILED DESCRIPTION OF PREFERRED EMBODIMENTS

Figure 1A:
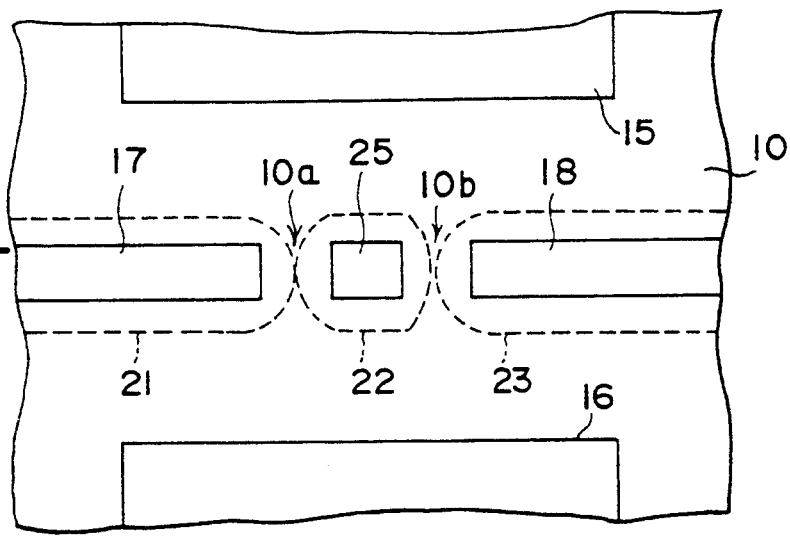
FIGS. 1(A)-1(C) are diagrams showing an example of the conventional quantum semiconductor device.
Figure 1B:
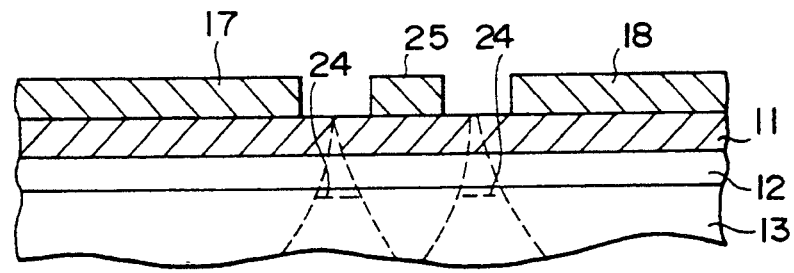
Figure 1C:
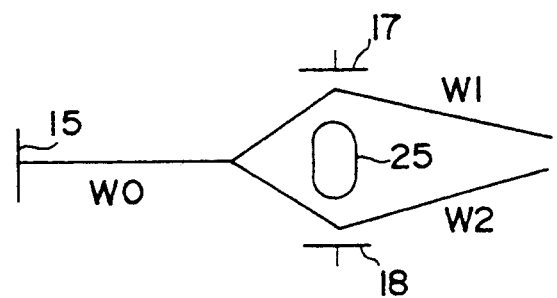
Figure 2:
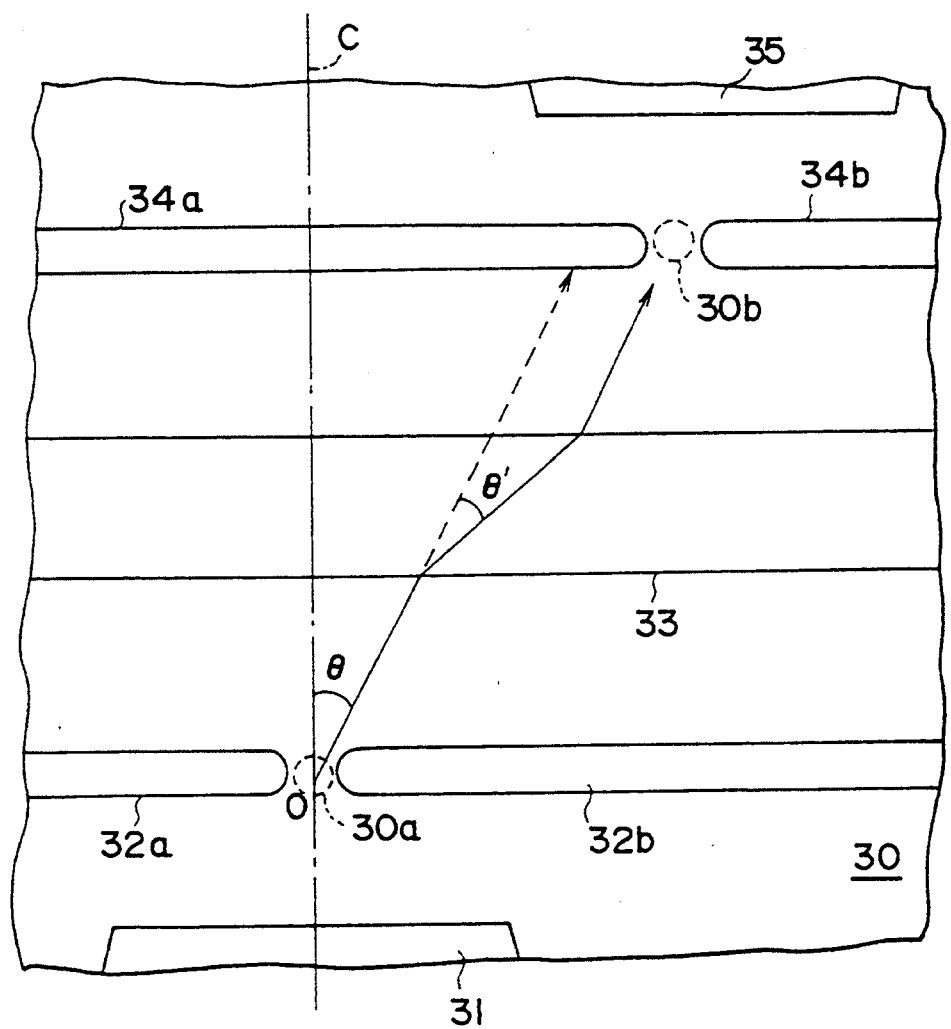
FIG. 2 is a diagram showing another example of the conventional quantum semiconductor device.
Figure 3:
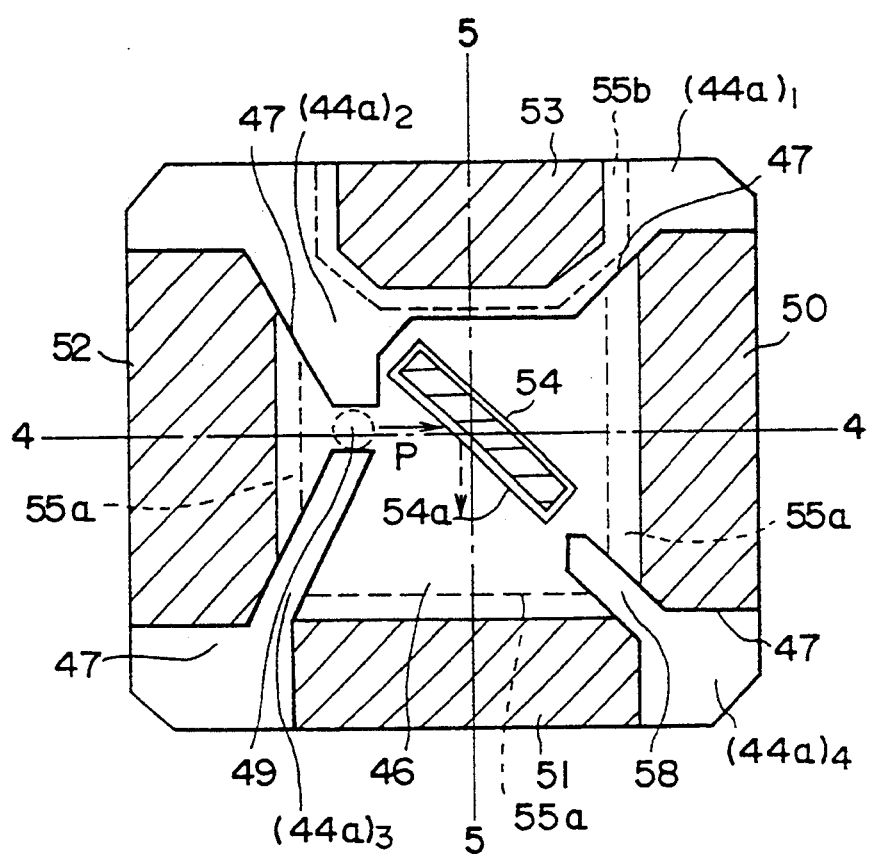
FIG. 3 is a diagram showing the structure of semiconductor device according to a first embodiment of the present invention in a plan view.
Figure 4:
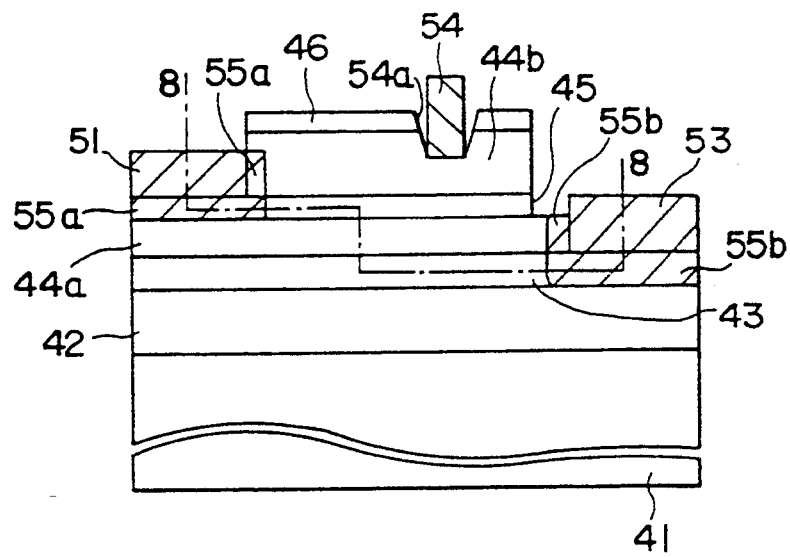
FIG. 4 is a diagram showing the structure of the device of FIG. 3 in a cross sectional view.

FIG. 3 shows the semiconductor device according to a first embodiment of the present invention in a plan view, while FIG. 4 shows the same device in a cross sectional view taken along a line 4—4 in FIG. 3. Further, FIG. 5 shows the device of FIG. 3 in a cross sectional view taken along a line 5—5 in FIG. 3.

Figure 5:
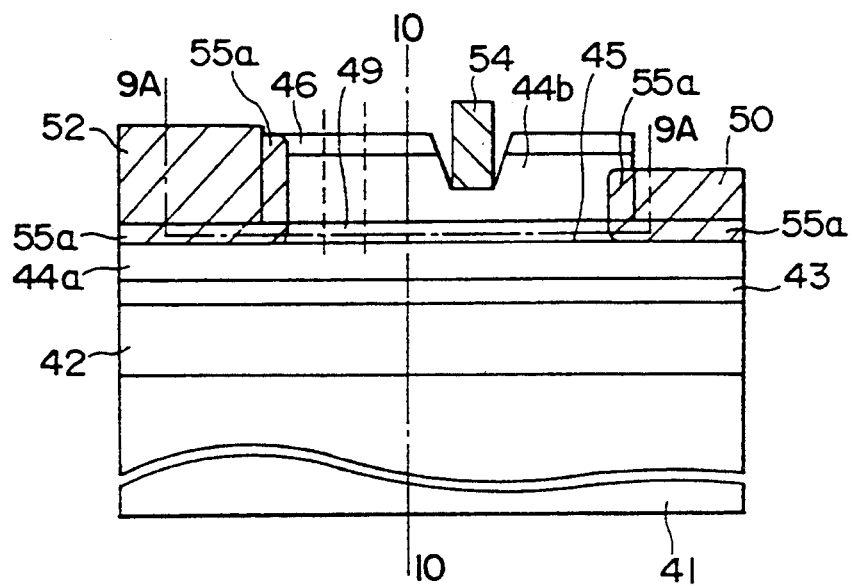
FIG. 5 is a diagram showing the structure of the device of FIG. 3 in another cross sectional view.

Referring to the cross sectional views of FIGS. 4 and 5, the device of the present embodiment is constructed on a semi-insulating substrate 41 of GaAs on which a buffer layer 42 of AlGaAs, doped to the p-type with an impurity concentration level of about $1 \times 10^{18}$ cm$^{-3}$ is provided with a thickness of about 1000 Å. On the buffer layer 42, a conductive layer 43 of GaAs, doped to the p-type with an impurity concentration level of about $1 \times 10^{17}$ cm$^{-3}$, is provided with a thickness of about 300 Å. Further, a lower barrier layer 44a of undoped AlGaAs is provided on the conductive layer 43 with a thickness of about 500 Å and a channel layer 45 of undoped GaAs is provided further on the lower barrier layer 44a with a thickness of about 150 Å. On the channel layer 45, an upper barrier layer 44b of undoped AlGaAs is provided with a thickness of about 2000 Å, and a cap layer 46 of n-type GaAs is provided with a thickness of about 200 Å.

In fabrication of the device, the foregoing semiconductor layers are deposited consecutively on the substrate 41 by a MOCVD process or MBE process, wherein one can obtain epitaxial layers of excellent crystal quality for the foregoing semiconductor layers by well established processes. For example, it is expected that one can achieve a mean free path of electrons of about 10 μm in the GaAs layer forming the channel layer 45.

In the layered structure described above, it should be noted that the channel layer 45 of undoped GaAs forms a typical quantum well in that the carriers are confined in the channel layer 45 vertically by the barrier layers 44a and 44b that have a bandgap substantially larger than that of the layer 45. Thereby, there appear discrete quantum levels in the energy level of the electrons and holes as is well known in the art. The energy gap between adjacent quantum levels increases with decreasing thickness of the layer 45, and the discrete quantum levels become appreciable when the thickness of the layer 45 has decreased approximately below the de Broglie wavelength of the carriers.

The layered semiconductor body thus obtained is then subjected to a patterning process such that the channel layer 45, the upper barrier layer 44b and the cap layer 46 are patterned to form a mesa structure 47 as shown in the plan view of FIG. 3, wherein the mesa structure 47 is formed such that the upper major surface of the channel layer 45 is exposed in correspondence to where ohmic electrodes 50-52 are to be formed. There, the ohmic electrodes 50 and 52 are formed of an AuGe-/Au alloy electrode formed of an Au-Ge layer having a thickness of about 200 Å and an Au layer having a thickness of about 3000 Å, wherein the electrodes 50 and 52 are provided to oppose with each other on a hypothetical line X—X of FIG. 3 with a separation of typically about 2 μm. On the other hand, the electrode 51 has a similar construction and is provided on a hypothetical line Y—Y in correspondence to a lower part of the device when viewed perpendicularly to the major surface of the substrate 41 as indicated in the plan view of FIG. 3. The electrodes 50-52 are subjected to an annealing process after deposition to form an alloy region 55a that extends from each of the electrodes in the lateral direction as well as in the vertical direction such that the alloy region 55a penetrates into the channel layer 45 located underneath as shown in the cross sectional view of FIGS. 4 and 5. Thereby, injection and recovery of carriers to and from the channel layer 45 become possible via the electrodes 50-52. The carriers thus injected travel through the undoped channel layer 45 ballistically along a quantum level formed therein at an energy level slightly higher than the energy level of the conduction band, while experiencing carrier confinement action by the barrier layers 44a and 44b. It should be noted that the foregoing separation of 2 μm between the ohmic electrode 52 and the ohmic electrode 50 is substantially smaller than the mean free path of electrons in the layer 45 that is about 10 μm as mentioned previously.

Further, the mesa structure 47 is formed such that the upper major surface of the lower barrier layer 44a is exposed in correspondence to regions $(44a)_1$–$(44a)_4$, wherein the regions $(44a)_2$ and $(44a)_3$ extend laterally toward the hypothetical axis X—X such that there is formed a neck region in the mesa structure 47. Typically, the neck region has a width of 1000 Å in Y—Y direction and a length of 2000 Å in the X—X direction and thereby forms a quantum point contact 49 in the channel layer 45. Thus, the electrons injected into the channel layer from the ohmic electrode 52 is radiated from the quantum point contact 49 in the form of electron wave with directivity.

In the mesa structure 47 of FIG. 3, there is provided a groove 58 to extend from the region $(44a)_4$ to expose the upper major surface of the barrier layer 44a, and the electrodes 50 and 51 are isolated from each other electrically by the groove 58. Further, an ohmic electrode 53 is provided on the exposed upper major surface of the layer 44a so as to be opposed with the electrode 51 on the hypothetical axis Y—Y, to establish an ohmic contact with the layer 44a as indicated by an alloy region 55b as shown in FIG. 4, wherein it will be noted that the alloy region 55b extends laterally as well as vertically and penetrates into the conductive layer 43 located underneath the electrode 53. Thus, by applying a voltage to the electrode 53, one can apply a bias voltage to the conductive layer 43.

On the mesa structure 47, there is provided an elongated Schottky electrode 54 in correspondence to an elongated groove 54a that is formed in the cap layer 56 to expose the upper barrier layer 44b, wherein the Schottky electrode 54 is provided on the hypothetical line X—X to extend obliquely thereto. By applying a control voltage, a potential corresponding to the electrode 54 is induced in the channel layer 45, and the electron wave radiated from the quantum point contact 49 experiences a reflection or refraction in response to the potential thus induced.

Hereinafter, the principle of the quantum point contact will be described with reference to FIGS. 6(A) and 6(B).

Figure 6:
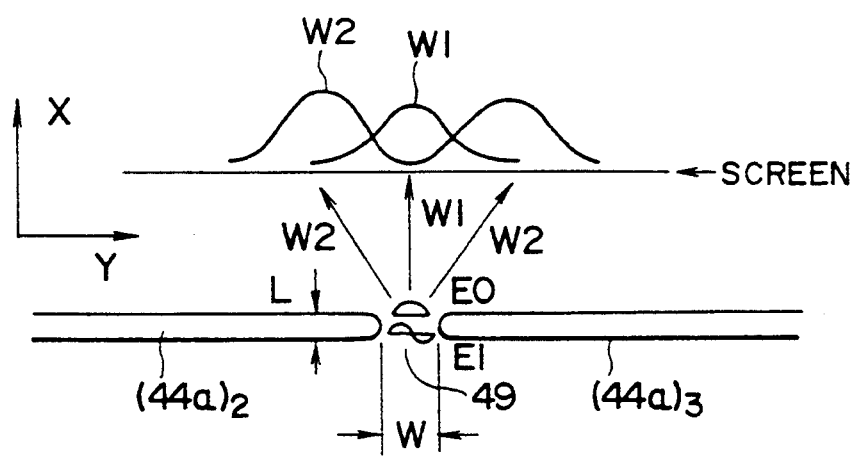
FIGS. 6(A) and 6(B) are diagrams showing the operation of a quantum point contact used in the device of FIG. 3.
Figure 6:
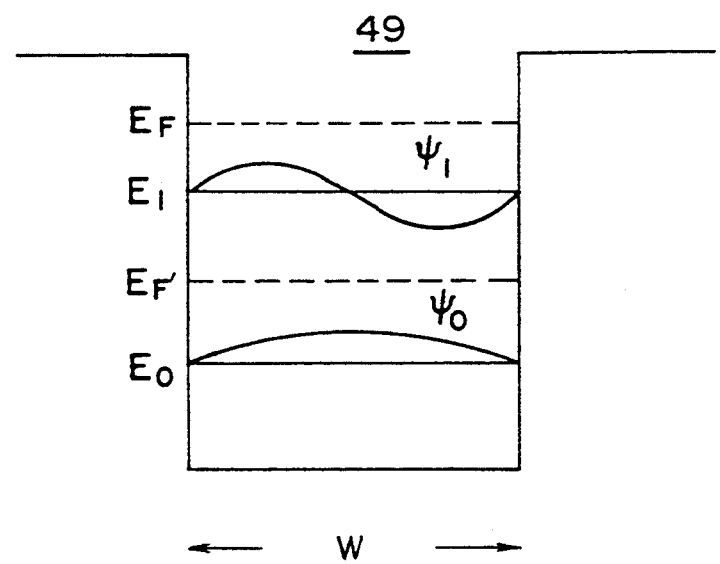

Referring to FIG. 6(A), this diagram shows the discrete quantum levels E0 and E1 that are formed in the quantum point contact 49 that in turn is formed between the grooves $(44a)_2$ and $(44a)_3$ as a passageway of the electrons. Thereby, the electrons injected at the ohmic electrode 52 are interrupted in correspondence to the grooves $(44a)_2$ and $(44a)_3$. As already described, the quantum point contact 49 has a limited lateral size as indicated by W that is sufficiently small to form discrete quantum levels E0, E1, . . . for the electrons that pass therethrough.

FIG. 6(B) shows the band diagram of the quantum point contact 49, wherein the foregoing quantum levels E0, E1 (E0 < E1) and associated wave functions $\psi_0$ and $\psi_1$ are shown.

The quantum level E0 corresponds to the ground level, and the wave function $\psi_0$ for the level E0 does not include a node in which the sign of the wave function changes. Such a pattern of the wave function indicates that there is no lateral component in the wave vector of the electron wave having the energy E0, and the electron wave of this mode exits from the quantum point contact 49 straight in the direction shown in FIG. 6(A) by W1. For example, when an electron wave having the energy corresponding to the Fermi level of $E_F'$ has entered into the quantum point contact 49, the electron wave has the wave vector $k_{W1}$ only in the X direction that is represented as $$k_{W1} = [2m\hbar)E_{F'} - E_0)]^{\frac{1}{2}}$$

where m represents the mass of the electron and ℏ represents the Planck's constant divided by $2\pi$.

On the other hand, the wave function $\psi_1$ for the higher mode does include such a node, and there appears a lateral component in the wave vector of the electron wave. For example, when an electron wave having an energy corresponding to the Fermi level $E_F$ has entered into the quantum point contact 28, the wave vector $k_Y$ of the electron wave in the Y direction that is parallel to the grooves $(44a)_2$ and $(44a)_3$, is represented as $$k_Y = [2m\hbar(E_F - E_1)]^{\frac{1}{2}},$$

while the wave vector in the X direction is represented as $$k_X = [2m\hbar(E_1 - E_0)]^{\frac{1}{2}}.$$

Thereby, the electron wave exits from the quantum point contact 49 in a direction W2 that is defined by the sum of the wave vectors $k_X$ and $k_Y$. There are two equivalent directions W2 about the X axis, and the electron wave thus exited from the quantum point contact 49 propagates in the W2 direction as indicated in FIG. 6(A) with a sharp directivity. Once exited, the electron wave resumes the original magnitude of the wave vector $k_F$ in the traveling direction. When a hypothetical screen for detecting the electrons is provided as illustrated, a pattern as shown by W2 would have been observed for the electron wave for the mode $E_1$, in addition to the pattern W1 corresponding to the electron wave in the mode $E_0$.

Thus, by setting the lateral size W of the quantum point contact 49 such that the Fermi level of the electrons injected at the ohmic electrode 52 agrees with the Fermi level $E_F'$ of FIG. 6(B), one can obtain an electron wave radiated straight in the X direction at the quantum point contact 49 with sharp directivity.

Next, the principle of controlling the flow an electron wave in the device of FIG. 3 will be described with reference to FIGS. 7(A) and 7(B).

Figure 7A:
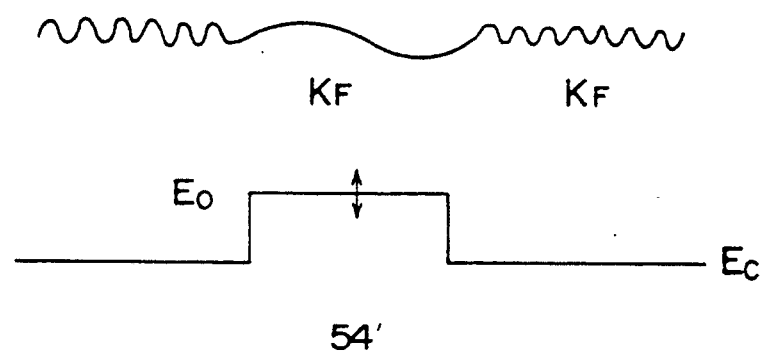
FIGS. 7(A) and 7(B) are diagrams showing the principle for controlling the flow of carriers in the device of FIG. 3.

Referring to FIG. 7(A) showing the potential profile in the channel layer 45 taken along the hypothetical line X—X of FIG. 3, it will be noted that a potential rise 54' having an energy $E_{101}$ is formed in the conduction band Ec in correspondence to the Schottky electrode 54, and such an energy rise induces a variation in the wave vector of the electron waves that passes under the electrode 54 with the Fermi energy $E_F$ as $$k_{F'} = [2m(E_F - E_\Phi)]^{\frac{1}{2}}/\hbar.$$

By controlling the energy level $E_\Phi$, one can modify the wave vector $k_{F'}$ of the carrier wave passing through the potential 54'. Upon exiting from the structure 34, the electron wave resumes the original wave vector $k_F$.

Figure 7B:
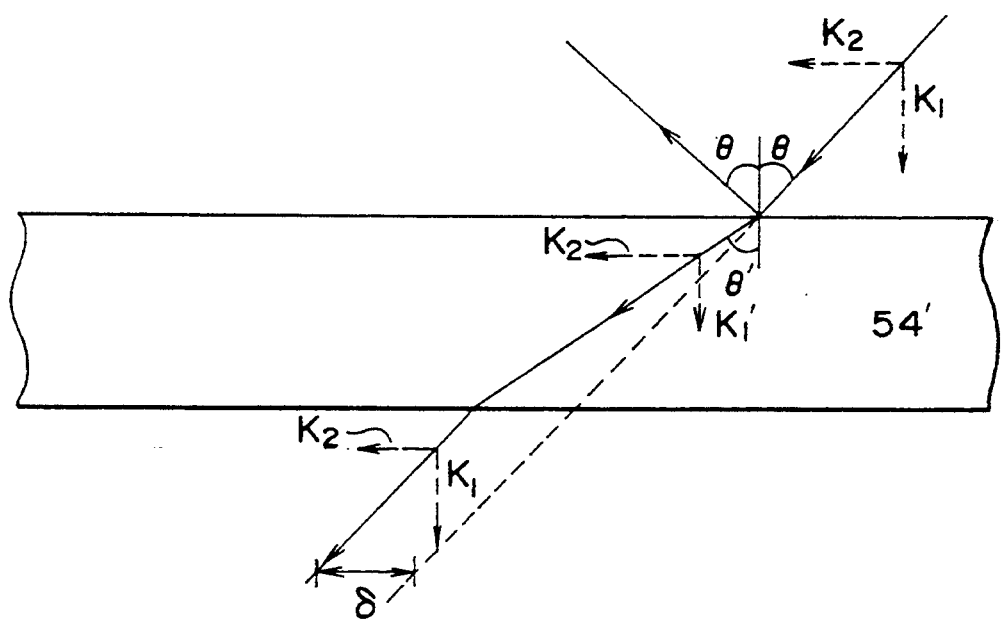

Considering now the case in which the electron wave enters into the potential 54' obliquely with the wave vector $k_X$ in the X-direction in correspondence to the Fermi energy $E_F$, the first component of the wave vector $k_1$, taken perpendicularly to the elongated direction of the potential 54' and hence to the elongated direction of the Schottky electrode 54, experiences the foregoing variation of the wave vector from $k_x$ to $k_x'$, and the velocity of the electron wave changes in response thereto similarly to the case of a light beam entering into a medium having a higher velocity as shown in FIG. 7(B). On the other hand, the second component of the wave vector $k_2$, taken along the elongated direction of the potential 54', remains uninfluenced and the electron wave experiences a refraction similar to the refraction of light beam.

Figure 8:
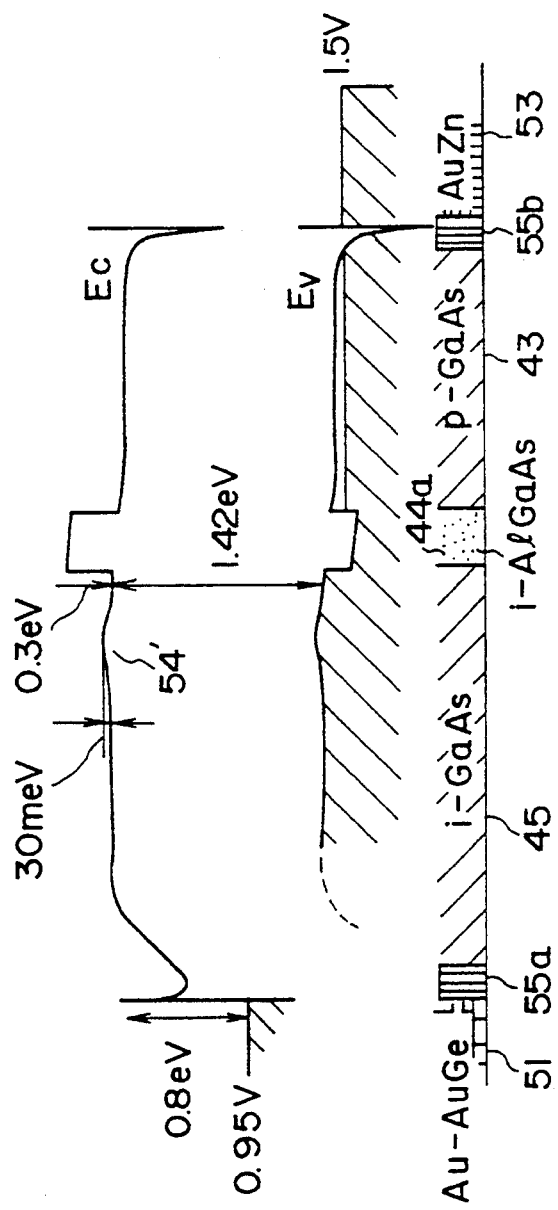
FIG. 8 is an energy diagram of the device of FIG. 3 taken along a line 8—8 shown in FIG. 4.
Figure 9:
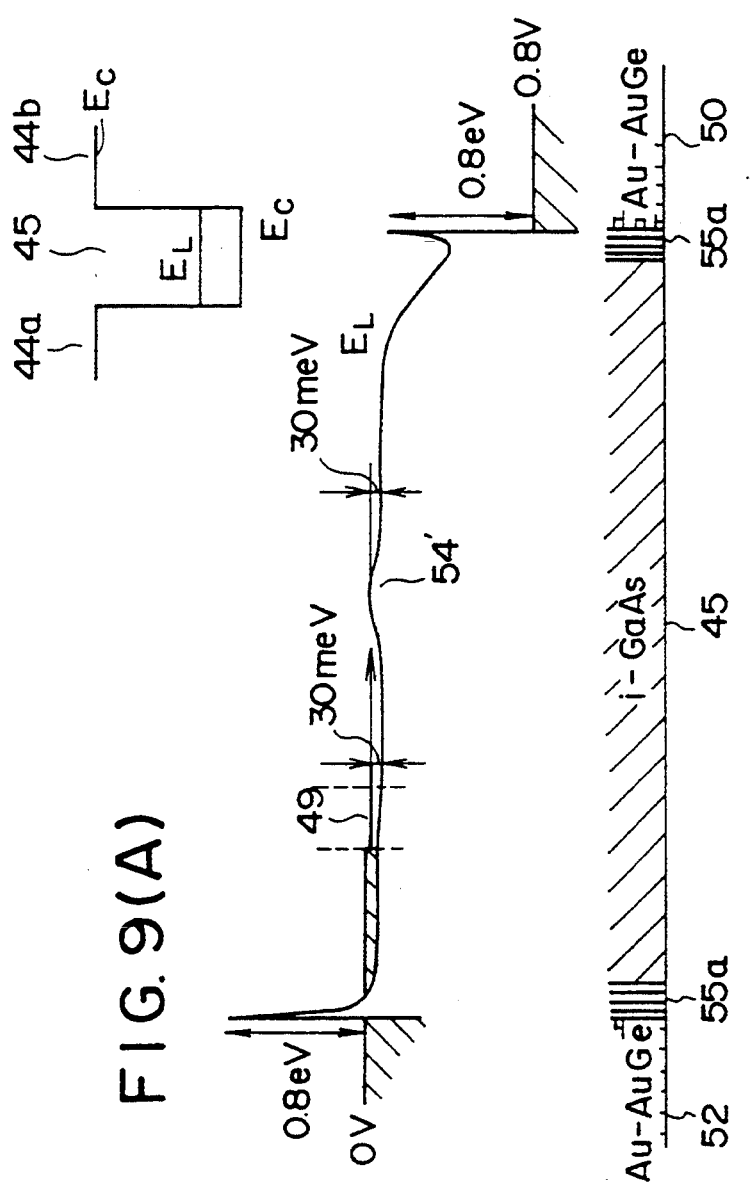
FIG. 9(A) is an energy diagram of the device of FIG. 3 taken along a line 9A—9A shown in FIG. 5.
FIG. 9(B) is an energy diagram showing the quantum well formed in the channel layer in the device of FIG. 3.
Figure 10:
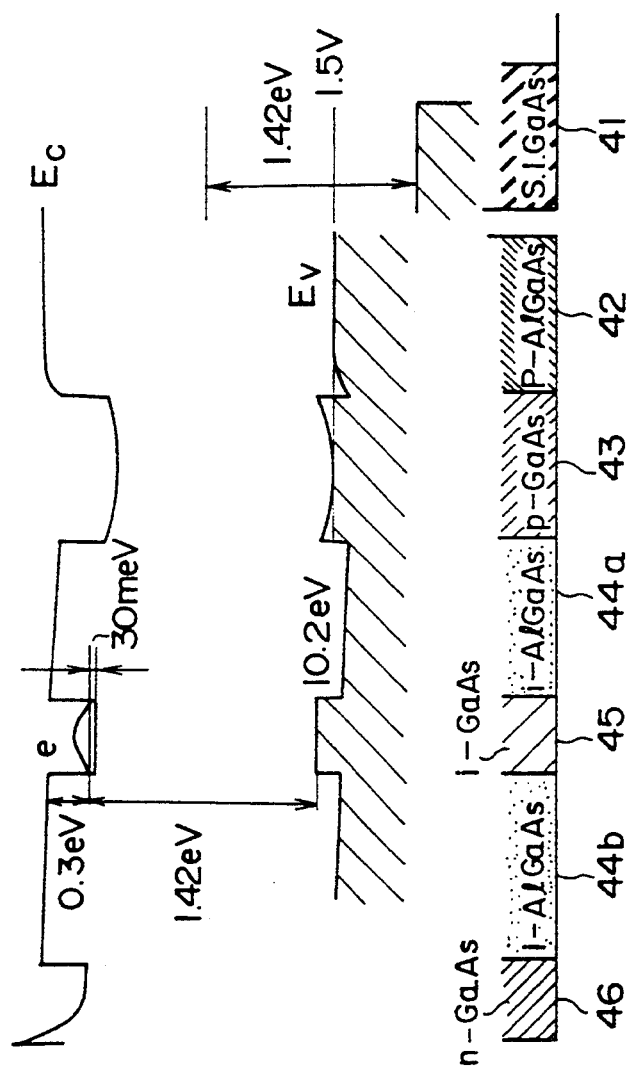
FIG. 10 is an energy diagram showing the device of FIG. 3 taken along a line 10—10 shown in FIG. 5.

Hereinafter, the operation of the semiconductor device of FIG. 3 will be described with reference to the band diagrams of FIGS. 8, 9(A), 9(B) and 10, wherein FIG. 8 shows a profile of the conduction band energy Ec and the valence band energy Ev taken along a line 8—8 shown in FIG. 4, FIG. 9(A) shows a similar profile taken along a line B—B in FIG. 5, and FIG. 10 shows the profile taken along a line 10—10 of FIG. 5.

Referring to FIG. 8 showing a case wherein a positive voltage of 0.95 volts is applied to the ohmic electrode 51 and another positive voltage of 1.5 volts is applied to the ohmic electrode 53, it will be noted that the energy level of the conductive layer 43 is controlled effectively by the voltage applied to the ohmic electrode 53, and the energy level of the channel layer 45 is determined by the energy level of the conductive layer 43 via the undoped lower barrier layer 44a. There, the energy level of the conductive layer 43 is held substantially constant in correspondence to the excellent conductivity in the layer 43, and the energy level within the channel layer 45 is also held substantially constant in response to the constant energy level of the conductive layer 43. It should be noted that the layer 43 forms a quantum well structure in the device of FIG. 3 with the holes acting as carrier. Thus, by providing the conductive layer 43 below the channel layer 45, one can not only control the potential profile in the layer 45 substantially flat but also the potential level thereof as desired.

Referring now to FIG. 9(A) showing a case wherein the potential level of the conductive layer 43 is biased in response to the bias voltage applied to the electrode 53 of FIG. 8, there appears an energy difference of about 30 meV between the Fermi level in the ohmic electrode 52 and the conduction band Ec of the channel layer 45, and the electrons are injected from the electrode 52 to the channel layer 45. There, the injected electrons fill the states formed above the quantum level $E_L$ in correspondence to a region of the layer 45 located between the electrode 52 and the quantum point contact 49. As shown in FIG. 9(B), the quantum level $E_L$ is formed slightly above the conduction band Ec of the channel layer 45.

The electrons are then injected, via the quantum point contact 49, to the right side region of the quantum point contact 49 in the form of hot electrons, wherein the hot electrons have an energy level higher than the quantum level $E_L$ by about 30 meV in the illustrated example. There, the hot electrons form a quantum mechanical wave which propagates through the channel layer 45 ballistically along a path P (see FIG. 3) in the direction toward the ohmic electrode 50 that is now biased positively with a voltage of about 0.8 volts. There, the potential barrier 54', formed in response to the control voltage applied to the control electrode 54, causes a refraction of the electron wave as described previously with reference to FIGS. 7(A) and 7(B). Thus, when there is a negative control voltage applied to the electrode 54 with a magnitude such that the potential 54' exceeds the foregoing level of 30 meV, the electron wave is reflected at the potential 54' toward the ohmic electrode 51 that is biased at the same level as the ohmic electrode 50, and the electrode 51 absorbs the electrons thus reflected thereto. Further, the electrode 51 absorbs any electrons that have been scattered during the transportation through the channel layer 45.

On the other hand, when there is no negative control voltage applied to the control electrode 54, the electron wave enters straight into the ohmic electrode 50 and induces a voltage change therein. Thus, by detecting the voltage change at the electrode 50, one can obtain the output voltage of the semiconductor device. It should be noted that the electrode 50 is electrically isolated from the electrode 51 by the groove 58 as already mentioned with reference to FIG. 3. Thus, any voltage change in the electrode 50 does not induce corresponding flow of electrons in the channel layer 45, and the problem of the output voltage being influenced by the corresponding flow of carriers as in the case of conventional quantum semiconductor devices, is successfully eliminated.

FIG. 10 shows the control of potential level in the channel layer 45 by the voltage applied to the conductive layer 43. As already noted, FIG. 10 represents the vertical profile of an energy band diagram taken along the line C—C of FIG. 5.

Referring to FIG. 10, it will be noted that the change in the voltage level of the conductive layer 43 induces a corresponding change in the potential level in the undoped barrier layer 44a, and the change in the potential level in the undoped barrier layer 44a in turn induces a change in the potential level of the channel layer 45. Thereby, one can hold the potential level of the channel layer 45 substantially constant by holding the voltage level of the conductive layer 43 at a constant voltage level. In the illustrated example, a positive voltage of 1.5 volts is applied to the conductive layer 43.

It should be noted that a p-type semiconductor material is used for the conductive layer 43 in the illustrated example. Although use of n-type semiconductor material may not be impossible for the layer 43, there appears a problem, when the layer 43 is doped to the n-type, in that electrons in the layer 43 tend to cause a leak to the drain regions 50 and 51 that are applied with a positive voltage.

It should be noted that excessive electrons, formed in the channel layer 45 and of which the potential is controlled as such, are absorbed by the electrode 51 in due course as mentioned previously.

Figure 11:
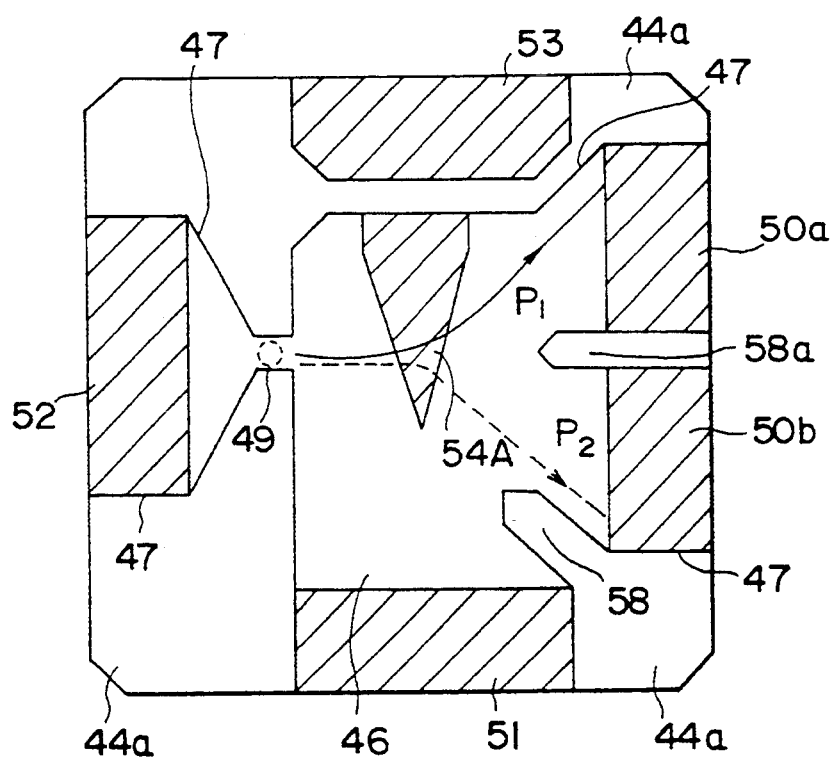
FIG. 11 is a diagram showing the semiconductor device according to a second embodiment of the present invention in a plan view.

Next, a second embodiment of the present invention will be described with reference to FIG. 11. In FIG. 11, those parts corresponding to the parts described previously are designated by the same reference numerals.

Referring to FIG. 11, the device uses a wedge-shaped control electrode 54A in place of the electrode 54 for causing a refraction of the incident electron beam. Thereby, the control electrode 54A induces a corresponding, wedge-shaped potential in the channel layer 45, and the wedge-shaped potential acts like an optical prism against the incident electron beam and switches the path of the incident electron beam between a first path $P_1$ and a second, different path $P_2$. Further, in correspondence to the first and second paths, the ohmic electrode 50 is now divided into a first electrode part 50a corresponding to the foregoing first path and a second electrode part 50b corresponding to the second path as shown by a groove 58a that exposes the upper major surface of the lower barrier layer 44a. Thereby, the incident electron beam is switched between the first electrode 50a and the second electrode 50b in response to the control voltage applied to the electrode 54A. Further, any scattered electrons are absorbed by the ohmic electrode 51. In this device, too, the two-dimensional electron gas is eliminated from the path of the electron wave in the device similarly to the first embodiment, and an reliable operation of the device is achieved with improved signal-to-noise ratio.

Generally, the device of the present invention as set forth in the first and second embodiments can operate up to a temperature of about 77K above which the scattering of electrons by thermally-excited phonons becomes appreciable. As compared with the conventional quantum semiconductor devices that can exhibit device operation only at the extremely low temperature such as 1K, the device of the present invention provides a significant improvement with respect to the signal-to-noise ratio, operational temperature range and the logic amplitude.

Further, it should be noted that the device of the present invention is not limited to the foregoing construction that uses compound semiconductor materials for the barrier layers 44a and 44b. More specifically, one may use insulating materials such as silicon oxide for the barrier layers 44a and 44b. Further, the channel layer 45 is not limited to compound semiconductor materials but a monoatomic semiconductor material such as silicon may be used.

Furthermore, it should be noted that the quantum point contact 49 may have a width that is larger than the width usually used for crating quantum mechanical carrier wave. In such a case, the carriers are radiated from the quantum point contact 49 merely as a ballistic flow of hot carriers. Even in such a case, the carriers have sharp directivity and one can control the flow of the carriers from the source electrode 52 to the drain electrode 50 in response to the control voltage applied to the control electrode. Thereby, the control electrode 54 acts to interrupt the flow of the ballistic carriers, rather than reflecting or refracting the carrier wave. Such an operational mode is particularly useful in the high temperature region such as 77K wherein the quantum mechanical carrier waves experience substantial scattering by phonons.

Further, the present invention is not limited to the embodiments described heretofore, but various variations and modifications may be made without departing from the scope of the invention.

What is claimed is:

1. A semiconductor device for switching a flow of ballistic carriers, comprising:
   a channel layer of an undoped semiconductor material operative for passing carriers therethrough, said channel layer having upper and lower major surfaces extending two-dimensionally, and thus in a longitudinal direction and in a lateral direction that is perpendicular to said longitudinal direction;
   carrier injection means, provided on said channel layer, for injecting carriers into said channel layer with directivity, such that the carriers comprise conducting carriers and travel ballistically through said channel layer in a predetermined direction along a carrier path, said channel layer being substantially free of any conducting carriers other than as injected by said carrier injection means;
   carrier detection means, provided on said channel layer, for detecting said carriers injected by said carrier injection means;
   carrier drainage means, provided on said channel layer, for absorbing carriers that have strayed away from said carrier path; and
   potential control means extending parallel to said upper and lower major surfaces of said channel layer, for controlling add thereby selectively setting a potential of said channel layer such that said selectively set potential is substantially constant in said channel layer, in each of said longitudinal and lateral directions, and enables said carrier injection means to inject carriers into said channel layers.

2. A semiconductor device as claimed in claim 1, wherein said channel layer is characterized by a carrier mean free path, and wherein said carrier detection means is separated from said carrier injection means by a distance that is substantially smaller than said carrier mean free path.

3. A semiconductor device as claimed in claim 1, wherein said carrier injection means comprises:
   an emitter electrode, in ohmic contact with said channel layer, which injects carriers into said channel layer; and
   a quantum point contact on said channel layer at a position so as to intervene between said emitter electrode and said carrier detection means, said quantum point contact comprising a conducting carrier passageway having a width which is sufficiently confined in said lateral direction such that discrete quantum levels are formed in said passageway and a length which is sufficiently small such that conducting carriers can pass through said passageway without experiencing substantial scattering and thereby radiating said carriers in the form of a quantum mechanical carrier wave.

4. A semiconductor device as claimed in claim 1, wherein said semiconductor device further comprises carrier control means, between said carrier injection means and said carrier detection means, for being supplied with, and responding to, a control voltage for switching a path of said carriers.

5. A semiconductor device as claimed in claim 4, wherein said carrier control means comprises a Schottky electrode which induces a potential in said channel layer.

6. A semiconductor device as claimed in claim 1, wherein each of said carrier detection means and said carrier drainage means comprises a respective ohmic electrode establishing an ohmic contact with said channel layer.

7. A semiconductor device as claimed in claim 6, wherein said ohmic electrode forming said carrier detection means and said ohmic electrode forming said carrier drainage means are separated from each other, said channel layer being non-existent in correspondence to a part thereof otherwise located between said ohmic electrode carrier detection means and said ohmic electrode carrier drainage means.

8. A semiconductor device as claimed in claim 1, wherein said potential control means comprises a semiconductor layer, doped to have a conductivity and having upper and lower major surfaces, located adjacent said lower major surface of said channel layer such that said upper major surface of said conductive semiconductor faces said lower major surface of said channel layer.

9. A semiconductor device as claimed in claim 8, wherein said potential control means further comprises an ohmic electrode in ohmic contact with said conductive semiconductor layer.

10. A semiconductor device as claimed in claim 8, wherein said conductive semiconductor layer is doped to a conductivity type that is opposite to a conductivity type of said carriers that are injected by said carrier injection means.

11. A semiconductor device as claimed in claim 1, wherein said carrier detection means comprises:
- a first ohmic electrode on said channel layer and in ohmic contact therewith;
- a second ohmic electrode on said channel layer and in ohmic contact therewith, said second ohmic electrode being separated from said first ohmic electrode; and
- said channel layer is non-existent in correspondence to a part thereof otherwise located between said first ohmic electrode and said second ohmic electrode.

12. A semiconductor device as claimed in claim 1, wherein said semiconductor device further comprises:
- a first confinement layer, having upper and lower major surfaces, in contact with said channel layer such that said upper major surface of said first confinement layer establishes an intimate contact with said lower major surface of said channel layer;
- a second confinement layer, having upper and lower major surfaces, in contact with said channel layer such that said lower major surface of said second confinement layer establishes an intimate contact with said upper major surface of said channel layer; and
- each of said first and second confinement layers has a bandgap substantially larger than a bandgap of said channel layer.

* * * * *

UNITED STATES PATENT AND TRADEMARK OFFICE
CERTIFICATE OF CORRECTION

PATENT NO.   : 5,369,288
DATED        : November 29, 1994
INVENTOR(S)  : Tatsuya USUKI It is certified that error appears in the above-indentified patent and that said Letters Patent is hereby corrected as shown below:

Col. 1,  line 17, change "speed" to --speeds--;
         line 47, delete "the".

Col. 2,  line 51, change "the passage" (second occurrence) to read --each passage 24--
         line 55, delete "," (first occurrence);
         line 68, delete "the".

Col. 5,  line 62, After "$1 \times 10^{18} cm^{-3}$" insert --,--.

Col. 8,  line 50, change "$E_{101}$" to --$E_\phi$--.

Col. 9,  line 3, after "thereto" insert --,--.

Signed and Sealed this

Eleventh Day of April, 1995

Attest:

BRUCE LEHMAN

*Attesting Officer*       *Commissioner of Patents and Trademarks*